(12) United States Patent
Radtke et al.

(10) Patent No.: US 11,820,700 B2
(45) Date of Patent: Nov. 21, 2023

(54) METHOD OF DEPOSITING A COATING UTILIZING A COATING APPARATUS

(71) Applicant: PILKINGTON GROUP LIMITED, Lathom (GB)

(72) Inventors: Michael Martin Radtke, Peru, IL (US); Steven Edward Phillips, Ottawa, IL (US)

(73) Assignee: Pilkington Group Limited, Lathom (GB)

( * ) Notice: Subject to any disclaimer, the term of this patent is extended or adjusted under 35 U.S.C. 154(b) by 147 days.

(21) Appl. No.: 17/126,141

(22) Filed: Dec. 18, 2020

(65) Prior Publication Data

US 2021/0101827 A1   Apr. 8, 2021

Related U.S. Application Data

(63) Continuation of application No. 14/392,012, filed as application No. PCT/GB2013/051899 on Jul. 16, 2013, now abandoned.

(60) Provisional application No. 61/677,277, filed on Jul. 30, 2012.

(51) Int. Cl.
*C03C 17/245* (2006.01)
*C23C 16/44* (2006.01)
*C23C 16/40* (2006.01)

(52) U.S. Cl.
CPC ......... *C03C 17/245* (2013.01); *C23C 16/402* (2013.01); *C23C 16/4401* (2013.01); *C03C 2217/213* (2013.01); *C03C 2218/152* (2013.01)

(58) Field of Classification Search
CPC ..... C23C 16/455; C23C 16/42; C23C 16/401; C03C 17/3417; C03C 17/245; C03C 2218/1525; C03C 2217/241; C03C 2217/213
USPC .................................................. 427/162–169
See application file for complete search history.

(56) References Cited

U.S. PATENT DOCUMENTS 5,798,142 A * 8/1998 Soubeyrand .......... C03C 17/245
427/255.18

FOREIGN PATENT DOCUMENTS

WO    WO-9904059 A1 * 1/1999 ........... C03C 17/002

* cited by examiner

*Primary Examiner* — Michael G Miller
(74) *Attorney, Agent, or Firm* — Marshall & Melhorn, LLC

(57) ABSTRACT

A method of depositing a coating utilizing a coating apparatus includes providing a coating apparatus above a glass substrate and forming a coating on a surface of the glass substrate while flowing a fluorine-containing compound into the coating apparatus. The fluorine-containing compound inhibits the formation of the coating on one or more portions of the coating apparatus.

15 Claims, 4 Drawing Sheets

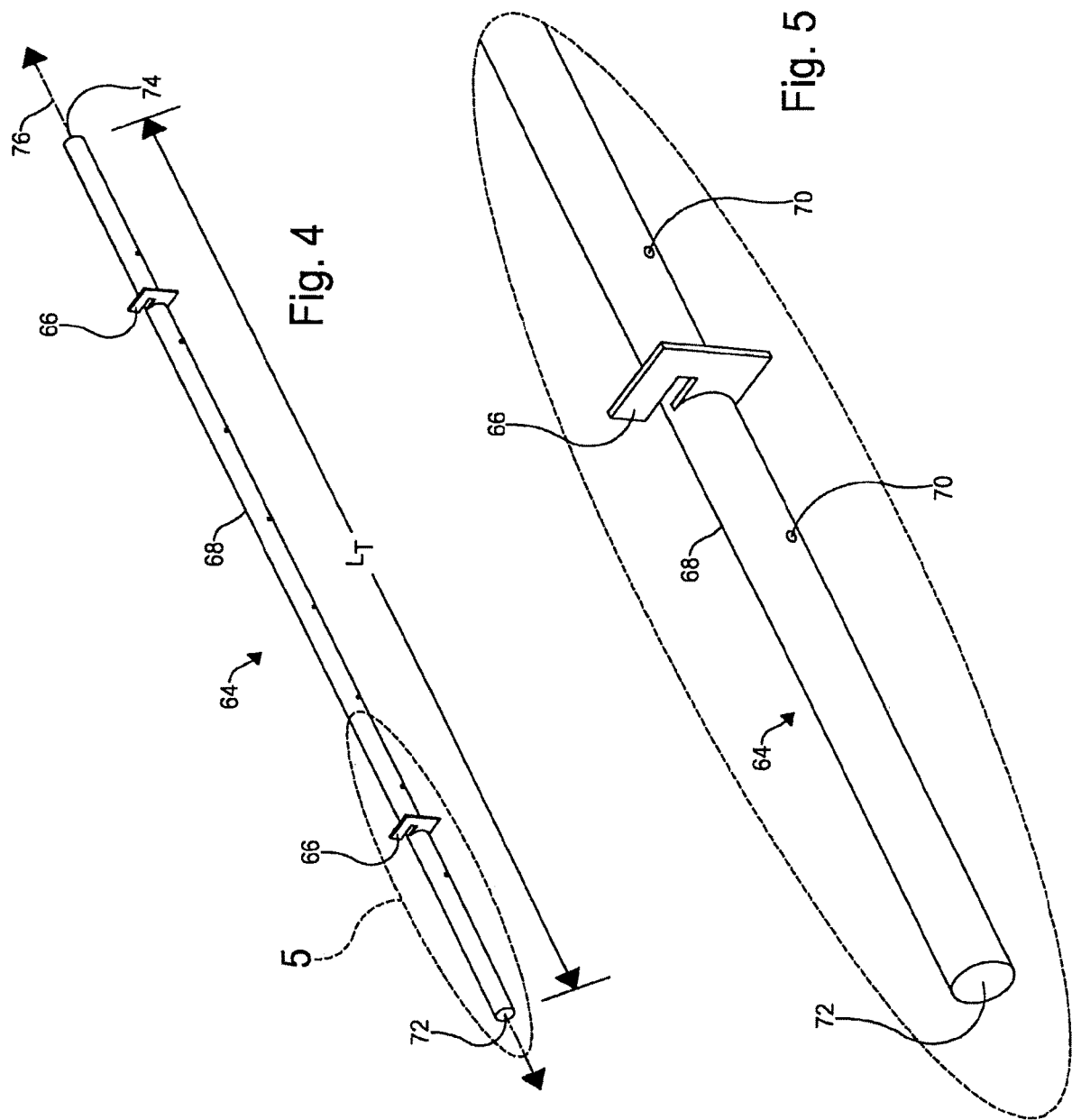

US 11,820,700 B2

METHOD OF DEPOSITING A COATING UTILIZING A COATING APPARATUS

BACKGROUND OF THE INVENTION

The invention relates to a method of depositing a coating using a coating apparatus. More specifically, the invention relates to a method which inhibits the formation of the coating and by-products which result from the deposition of the coating on the coating apparatus during the deposition of the coating on a glass substrate.

Thin film coatings may be formed using a coating apparatus to deposit a thin film coating on, for example, a glass substrate during the glass manufacturing process. However, the processes known for the production of coatings which comprise oxides of silicon on glass substrates utilize precursor materials (reactants) which can react undesirably. For example, known precursor materials may react to form by-products before and during formation of the coating on the glass substrate. The resulting by-products, which often take the form of fine particles or powder, can create blockages in the coating apparatus. To produce an aesthetically-pleasing and uniform coating on the glass substrate, the powder must be removed from the coating apparatus.

Various methods for removing powder from a coating apparatus are known. For example, powder can be removed mechanically from a coating apparatus. Mechanical removal of powder can be performed after depositing the coating. However, this method suffers from shortened deposition run times and is time consuming and labor intensive.

Alternatively, U.S. Pat. No. 6,857,433 teaches a cleaning method for a glass-coating reactor. The method requires that the reactor contain a glass substrate within a chamber and that the flow of the deposition gas to the reactor be terminated. Next, a cleaning gas is added to the reactor to react with substances formed on an internal surface of the chamber. This method also suffers from shortened deposition runs as the coating process is interrupted to remove the substances formed on the chamber.

Therefore, it is desired to devise an improved process for the deposition of coatings which comprise an oxide of silicon over glass substrates.

BRIEF SUMMARY OF THE INVENTION

A method of depositing a coating utilizing a coating apparatus is provided. In an embodiment, the method comprises providing a coating apparatus above a glass substrate and forming a coating on a surface of the glass substrate while flowing a fluorine-containing compound into the coating apparatus. The fluorine-containing compound inhibits the formation of the coating on one or more portions of the coating apparatus.

In another embodiment or aspect, the method comprises providing a coating apparatus above a moving glass substrate. The coating apparatus has one or more exhaust gas passages. The method also comprises forming a silica coating on a surface of the glass substrate while flowing a fluorine-containing compound into the coating apparatus. The silica coating contains no fluorine or only trace amounts thereof. The fluorine-containing compound inhibits the formation of the silica coating in the one or more exhaust gas passages.

Preferably, the coating comprises an oxide of silicon. Preferably, the glass substrate is moving. Preferably, the method further comprises positioning the coating apparatus within a deposition chamber. Preferably, the coating is formed on the surface of the glass substrate by chemical vapor deposition. Preferably, the glass substrate is at a temperature of between about 1050° F. (566° C.) and 1400° F. (760° C.). Preferably, the coating contains no fluorine or only trace amounts thereof.

Preferably, the coating apparatus comprises one or more exhaust gas passages and the fluorine-containing compound is introduced into an exhaust gas passage. Preferably, the fluorine-containing compound is anhydrous HF. Preferably, the fluorine-containing compound inhibits the formation of the coating within one or more exhaust gas passages. Preferably, the fluorine-containing compound inhibits the formation of the coating on a surface of the coating apparatus.

Preferably, the method comprises forming a gaseous mixture comprising a silicon-containing compound, an oxygen-containing compound and a radical scavenger, flowing the gaseous mixture into the coating apparatus and directing the gaseous mixture through the coating apparatus to the surface of the glass substrate.

Preferably, the fluorine-containing compound flows into the coating apparatus prior to forming the coating on the surface of the glass substrate. Preferably, the coating is a silica coating. Preferably, the fluorine-containing compound is introduced into each exhaust gas passage via separate gas distribution tubes. Preferably, the ratio of fluorine-containing compound to silicon-containing compound flowing into the coating apparatus is equal to or greater than 2:1. Preferably, the ratio of fluorine-containing compound to silicon-containing compound flowing into the coating apparatus is equal to or greater than 4:1.

In a further aspect, the invention provides a method of depositing a coating utilizing a coating apparatus, comprising: providing a coating apparatus which comprises one or more exhaust gas passages above a moving glass substrate; and forming a silica coating on a surface of the glass substrate which contains no fluorine or only trace amounts thereof while flowing a fluorine-containing compound into the coating apparatus, wherein the fluorine-containing compound inhibits the formation of the silica coating in the one or more exhaust gas passages.

Preferably, the glass substrate is at a temperature of between about 1050° F. (566° C.) and 1400° F. (760° C.).

Preferably, the method further comprising forming a gaseous mixture comprising a silicon-containing compound, an oxygen-containing compound and a radical scavenger, flowing the gaseous mixture into the coating apparatus and directing the gaseous mixture through the coating apparatus to the surface of the glass substrate and wherein the ratio of fluorine-containing compound to silicon-containing compound flowing into the coating apparatus is equal to or greater than 4:1.

In a further aspect, the invention provides a coated glass substrate comprising a coating, the coating being deposited by utilizing a coating apparatus, comprising: providing a coating apparatus above a glass substrate; and forming a coating on a surface of the glass substrate while flowing a fluorine-containing compound into the coating apparatus, wherein the fluorine-containing compound inhibits the formation of the coating on one or more portions of the coating apparatus.

All of the features described herein may be combined with any one of the above aspects, in any combination.

BRIEF DESCRIPTION OF THE DRAWINGS

The above, as well as other advantages of the present invention will become readily apparent to those skilled in the art from the following detailed description when considered in the light of the accompanying drawings in which:

FIG. 4 shows a perspective view of a gas distribution tube according to an embodiment of the invention; and FIG. 5 shows a perspective view of a portion of the gas distribution tube of FIG. 4.

DETAILED DESCRIPTION OF THE INVENTION

It is to be understood that the invention may assume various alternative orientations and step sequences, except where expressly specified to the contrary. It is also to be understood that the specific apparatuses and methods illustrated in the attached drawings, and described in the following specification are simply exemplary embodiments of the inventive concepts. Hence, specific dimensions, directions, or other physical characteristics relating to the embodiments disclosed are not to be considered as limiting, unless expressly stated otherwise.

Figure 1:
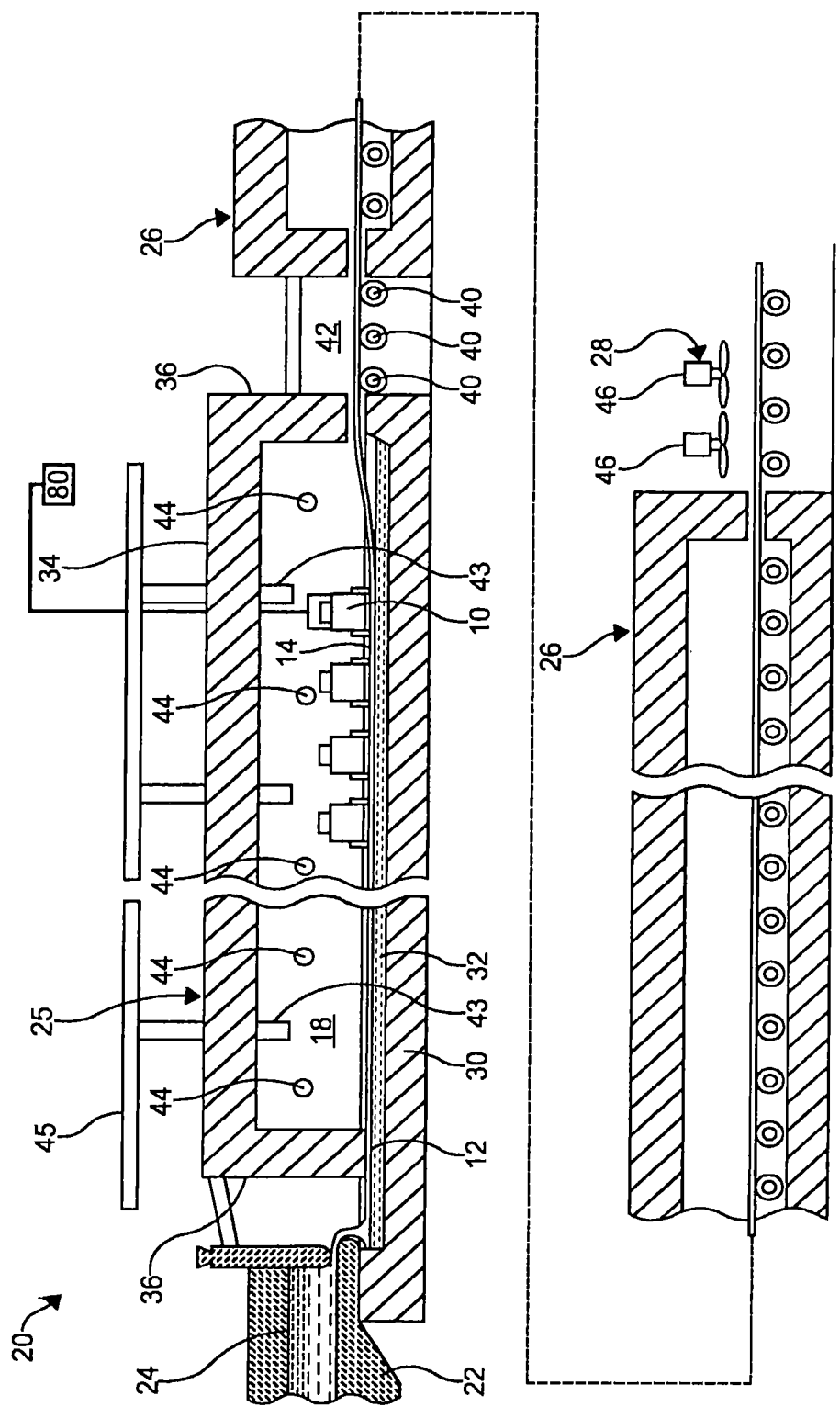
FIG. 1 shows a schematic view of a float glass installation according to an embodiment of the invention.

A method of depositing a coating is provided. Referring now to FIG. 1, in an embodiment, the method comprises providing a coating apparatus 10 above a glass substrate 12 and forming the coating on a surface 14 of the substrate 12 while flowing a fluorine-containing compound into the coating apparatus 10. Preferably, the coating contains no fluorine or only trace amounts thereof. The fluorine-containing compound inhibits the formation of the coating and/or by-products resulting from the deposition of the coating on one or more portions of the coating apparatus 10. As used herein, the term "inhibits," derivatives thereof, and other terms of similar import refers to the removal or prevention of the coating and/or by-products resulting from the deposition of the coating from forming on one or more portions of the coating apparatus.

Preferably, the coating comprises an oxide of silicon. More preferably, the coating is of silicon dioxide ($SiO_2$) which hereinafter will be referred to as "silica." Preferably, the silica coating comprises essentially silicon and oxygen. However, trace amounts of contaminants of, for example, carbon and/or fluorine may be contained in the silica coating.

The method will be described in connection with depositing a silica coating. However, it should be appreciated that the method is not limited in use with the deposition of silica coatings. For example, a silicon oxycarbide or silicon oxynitride coating may be deposited utilizing the method.

In certain embodiments, the method will be described in connection with forming a coated glass article. The coated glass article may have many uses and can be utilized in many applications. For example, the coated glass article may be utilized in architectural glazings. The coated glass article can also be utilized in solar, electronic, automotive and aerospace applications.

Preferably, the coating apparatus 10 is positioned within a deposition chamber 18. The method can advantageously be performed in situ while the coating apparatus 10 is positioned within the deposition chamber 18. Additionally, the method does not require discontinuing forming the coating on the glass substrate 12. Thus, the method described herein allows for longer deposition runs than those known. Finally, the method inhibits the formation of by-products which result from the deposition of the coating such as, for example, silicon oxide, whereas known processes attempt to remove by-products after they form.

Preferably, the silica coating is formed utilizing precursor materials and by a chemical vapor deposition (CVD) method. More preferably, the deposition surface 14 of the glass substrate 12 is at essentially atmospheric pressure when the silica coating is formed thereover or thereon. Thus, the silica coating may be formed by an atmospheric pressure CVD (APCVD) method. However, it should be appreciated that the silica coating may be formed by another CVD method.

A feature of the method is that it allows for the formation of the silica coating at a commercially viable deposition rate and, as above-noted, does not require discontinuing the formation of the silica coating on the glass substrate or displacing the coating apparatus 10 until it is desired to do so. High deposition rates are important when depositing coatings on a glass substrate. This is particularly true if the glass substrate 12 is a glass ribbon travelling at a line speed in the range of several hundred inches per minute and it is desired to deposit the silica coating at a specific thickness in fractions of a second. For example, the method inhibits the formation of the coating and/or by-products on one or more portions of the coating apparatus 10 while forming the silica coating on the deposition surface 14 of the glass substrate 12 at a deposition rate of, for example, about 5 or more nanometers per second (nm/sec).

For any particular combination of precursor materials, the optimum concentrations and flow rates for achieving a particular silica deposition rate on the glass substrate may vary. Also, as should be appreciated, for any particular combination of precursor materials, the optimum concentrations and flow rates for achieving a particular deposition rate may be determined by trial or by computer modeling. It will also be appreciated that the use of higher concentrations and/or higher flow rates of a particular precursor material may result in less efficient overall conversion of the reactants into the silica coating, so that the optimum conditions for commercial operation may differ from the conditions which provide the highest deposition rates.

In an embodiment, the glass substrate 12 is a soda-lime-silica glass. In this embodiment, the glass substrate 12 may be substantially transparent. However, the method is not limited to transparent glass substrates as translucent glass substrates may also be utilized in practicing the method. Furthermore, the transparency or absorption characteristics of the glass substrate 12 utilized may vary between embodiments of the invention. Likewise, the invention is not limited to utilizing a substrate 12 having a particular composition as, for example, glass substrates 12 of a borosilicate composition can be utilized in the method. Additionally, the method is not limited to a particular glass substrate thickness.

In an embodiment, the method may be practiced under dynamic deposition conditions. In this embodiment, the glass substrate 12 is moving during formation of the silica coating. In another embodiment, the glass substrate 12 may be heated. Preferably, in this embodiment, the temperature of the glass substrate 12 is between about 1050° F. (566° C.) and 1400° F. (760° C.) when the silica coating is formed thereover or thereon. Preferably, the glass substrate 12 is moving and heated when practicing the method.

The method may be practiced in conjunction with the manufacture of the glass substrate 12. The manufacture of the glass substrate 12 may be carried out utilizing the well-known float glass manufacturing process. In these embodiments, it is preferred that the glass substrate 12 is a glass ribbon and, when these embodiments of the method are being described, the glass substrate 12 may be referred to herein as such. Most preferably, the glass substrate 12 is moving, heated and a glass ribbon when practicing the method.

An exemplary illustration of a float glass installation 20 utilized in the float glass manufacturing process is shown in FIG. 1. It should be appreciated that the float glass installation 20 described herein and shown in FIG. 1 is only illustrative of such installations and that the method is not limited to use with only the installation of FIG. 1. Also, it should be appreciated that the method can be practiced apart from the float glass manufacturing process or well after formation and cutting of the glass substrate.

As illustrated in FIG. 1, the float glass installation 20 comprises a canal section 22 along which molten glass 24 is delivered from a melting furnace, to a float bath section 25 where the glass ribbon is formed. The glass ribbon advances from the float bath section 25 through an adjacent annealing lehr 26 and a cooling section 28. The float bath section 25 includes a bottom section 30 within which a bath of molten tin 32 is contained, a roof 34, opposite sidewalls (not shown) and end walls 36. In this embodiment, the roof 34, sidewalls and end walls 36 together define the deposition chamber 18. For describing this and other embodiments, the deposition chamber 18 may be referred to as a float bath chamber. In these embodiments, a non-oxidizing atmosphere is maintained in the deposition chamber 18.

The glass ribbon is removed from the float bath section 25 over lift out rolls 40 and is thereafter conveyed through the annealing lehr 26 and the cooling section 28 on aligned rolls. The deposition of the silica coating preferably takes place in the float bath section 25 and, specifically, the float bath chamber. However, it may be possible for deposition to take place further along the glass production line, for example, in a gap 42 between the float bath section 25 and the annealing lehr 26, or in the annealing lehr 26.

The non-oxidizing atmosphere is generally nitrogen or a mixture of nitrogen and hydrogen in which nitrogen predominates and is maintained in the float bath chamber to prevent oxidation of the molten tin 32. The atmosphere gas is admitted through conduits 43 operably coupled to a distribution manifold 45. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere.

For purposes of describing the method, the above-noted pressure range is considered to constitute normal atmospheric pressure. It should be noted that in addition to the pressure of the float bath chamber, the pressure of the annealing lehr 26 and/or in the gap 42 between the float bath section 25 and the annealing lehr 26 may be at essentially atmospheric pressure and the coating apparatus 10 may be located therein to practice the method. However, it should also be noted that the method is not limited to being practiced at essentially atmospheric pressure. Thus, the silica coating may be formed and the method may be practiced under low-pressure conditions.

Heat for maintaining the desired temperature regime in the molten tin 32 and the float bath chamber is provided by radiant heaters 44 within the chamber. The atmosphere within the lehr 26 is typically atmospheric air, as the cooling section 28 is not enclosed and the portion of the glass ribbon therein is open to the ambient atmosphere. Ambient air may be directed against the glass ribbon as by fans 46 in the cooling section 28. Heaters (not depicted) may also be provided within the annealing lehr 26 for causing the temperature of the glass ribbon to be gradually reduced in accordance with a predetermined regime as it is conveyed there through.

The precursor materials utilized to form the silica coating are delivered at a temperature below the temperature at which they react to form the silica coating and the glass substrate 12 is at a temperature above the reaction temperature. Such materials may at some point be a liquid or a solid but are volatile such that they can be vaporized for use in a gaseous state. Once in a gaseous state, the precursor materials are delivered to the deposition surface 14 of the glass substrate 12 and chemically react in a predetermined manner. The reaction results in the deposition of the silica coating on the glass substrate 12.

The gaseous precursor materials are mixed to form the silica coating on the glass substrate 12. The precursor materials may be mixed within or outside of the coating apparatus 10 to form the gaseous mixture. In an embodiment, separate supply lines extend from the sources of the precursor materials to the coating apparatus 10. In this embodiment, the precursor materials are mixed within the coating apparatus 10 or outside of the coating apparatus 10 after being discharged therefrom to form the gaseous mixture. Alternatively, the precursor materials may be supplied to the coating apparatus 10 in a single feed. In this embodiment, the gaseous mixture of precursor materials is formed prior to being fed to the coating apparatus 10.

Preferably, the gaseous mixture includes precursor materials suitable for forming the silica coating at essentially atmospheric pressure. In an embodiment, the gaseous mixture of precursor materials comprises a silicon-containing compound, an oxygen-containing compound, and a radical scavenger.

Preferably, the silicon-containing compound is a silane compound. A preferable silane compound is monosilane ($SiH_4$). However, the method is not limited to utilizing only monosilane as other silane compounds are suitable for use in forming the silica coating. For example, diclorosilane ($SiH_2Cl_2$) and/or trichlorosilane ($SiHCl_3$) are suitable silane compounds for use in forming the silica coating.

Preferably, the oxygen-containing compound is oxygen ($O_2$) or water ($H_2O$). Oxygen may be provided as a part of a gaseous composition such as air. In another embodiment, oxygen is provided in a substantially purified form. In either embodiment, the oxygen is in the form of molecular oxygen. Water may be provided as steam. The gaseous precursor mixture may also comprise both oxygen and water.

Preferably, the radical scavenger is a hydrocarbon gas. Preferred hydrocarbon gases are ethylene ($C_2H_4$) or propylene ($C_3H_6$). U.S. Pat. No. 5,798,142, which is incorporated by reference in its entirety herein, teaches the formation of a silica coating by combining a radical scavenger, silane, oxygen, and a carrier gas to form a gaseous precursor mixture.

Inert gas may be utilized with the precursor materials as carrier and/or diluent gas. Suitable inert gases include nitrogen ($N_2$), hydrogen ($H_2$), helium (He) and mixtures thereof. In an embodiment, the precursor mixture includes one or more inert gases selected from the group consisting of $N_2$, $H_2$, He and mixtures thereof.

Figure 2:
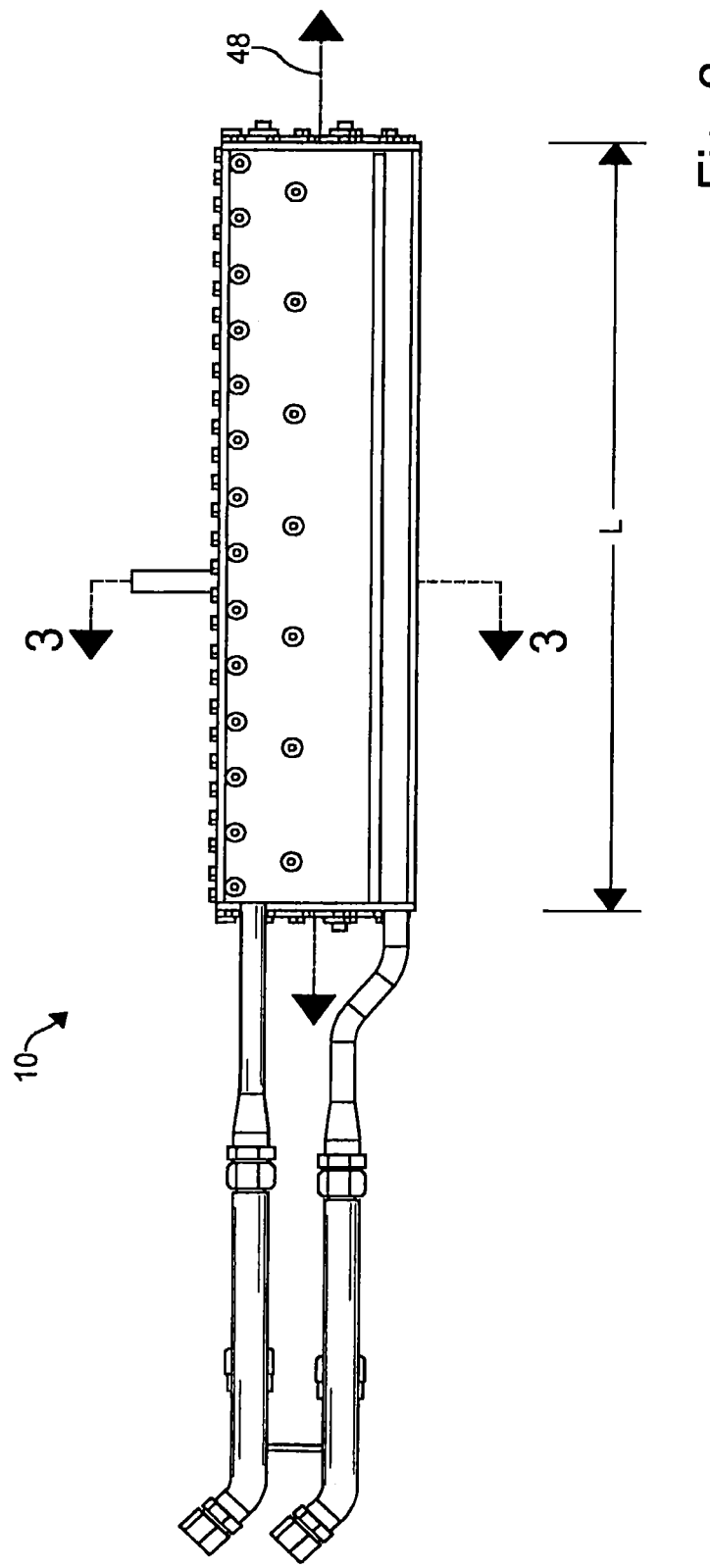
FIG. 2 shows a schematic view of a coating apparatus according to an embodiment of the invention.
Figure 3:
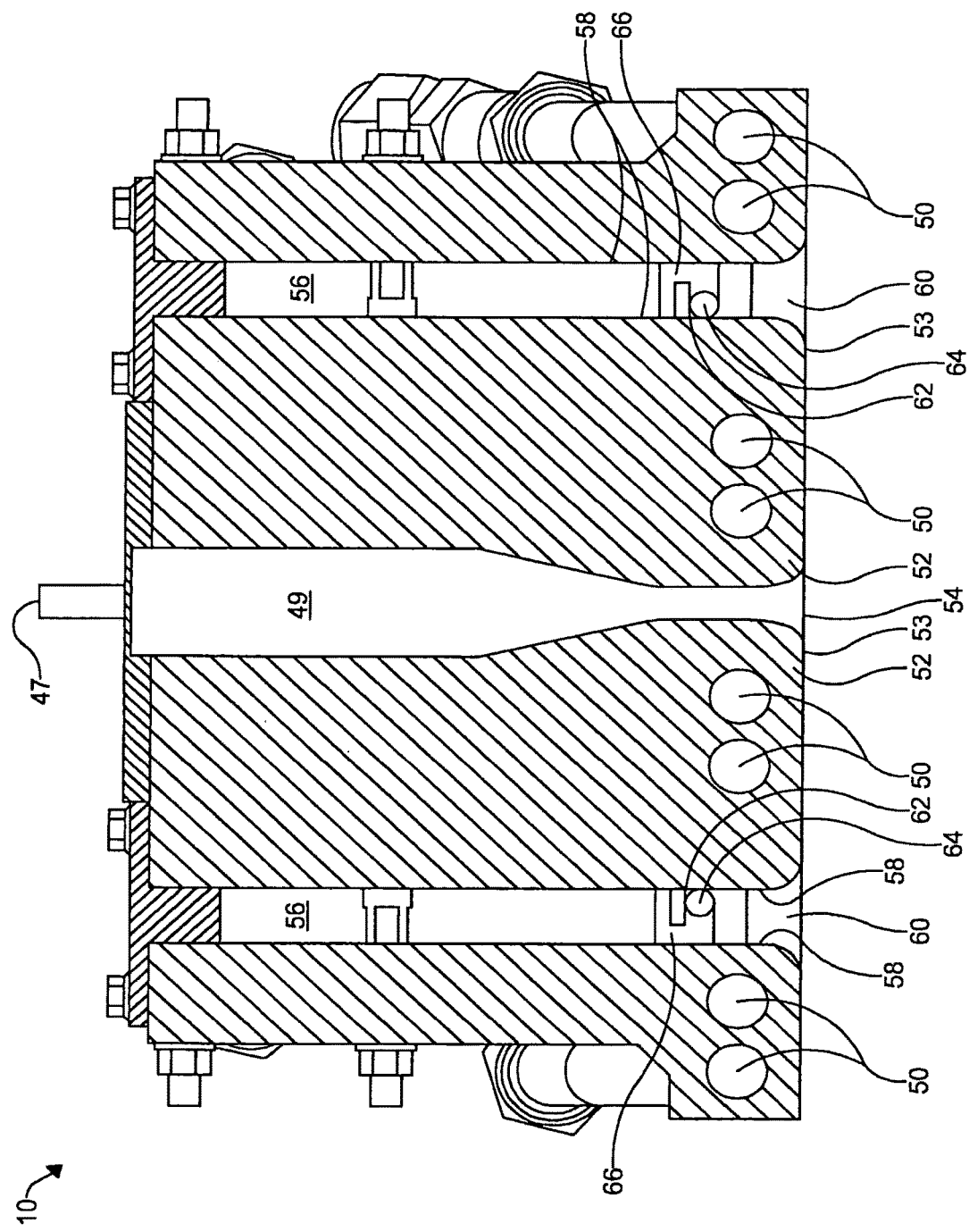
FIG. 3 shows a cross-sectional view of the coating apparatus of FIG. 2.

A coating apparatus 10 suitable for use in the method is best illustrated in FIGS. 2 and 3. The precursor materials flow into the coating apparatus 10 via one or more inlets 47. The one or more inlets are in fluid communication with a conduit 49 which directs the precursor materials through the coating apparatus 10. The conduit 49 is in fluid communication with an outlet 54. The precursor materials are discharged from the coating apparatus 10 from the outlet 54.

The coating apparatus 10 may comprise a long axis 48 and be of a length L that is substantially equal to, slightly less than or slightly greater than the width of the glass substrate 12. Additionally, as depicted in the embodiment of FIG. 2, the coating apparatus 10 may have a generally rectangular shape. However, as should be appreciated, the method may be utilized with a coating apparatus having a configuration which differs from the above-described and further descriptions of coating apparatuses suitable for practicing the method can be found in U.S. Pat. No. 4,922,853 and U.S. patent application Ser. No. 13/426,697, the entire disclosures of which are hereby incorporated by reference.

The internal temperature of the coating apparatus 10 may be controlled. The internal temperature of the coating apparatus 10 may be controlled by any suitable means. For example, the temperature of the coating apparatus 10 may be controlled by utilizing a suitable heat transfer medium in certain portions 50 of the coating apparatus 10.

In certain embodiments, the coating apparatus 10 may comprise one or more face portions 52. As shown in FIG. 2, in an embodiment, the coating apparatus 10 comprises two face portions 52. The precursor materials are discharged from the outlet 54 which is adjacent and separates the face portions 52 from each other. Thus, the precursor materials are discharged from the coating apparatus 10 between the face portions 52.

Each face portion 52 comprises a face surface 53. The face surfaces 53 are aligned with each other and positioned in a parallel relationship with the glass substrate 12. The face portions 52 and outlet 54 are of lengths which may be substantially equal. In an embodiment, the lengths of the face portions 52 and outlet 54 are substantially equal to the length L of the coating apparatus 10.

Preferably, the coating apparatus 10 comprises one or more exhaust gas passages 56. As illustrated in FIG. 3, the coating apparatus 10 may comprise two exhaust gas passages 56. The exhaust gas passages 56 allow for the continuous removal of spent or unused gaseous precursor materials and/or inert gases which might otherwise create undesired contaminants on the deposition surface 14 of the glass substrate 12. The exhaust gas passages 56 are separated from the outlet 54 by the face portions 52 of the coating apparatus 10. In this embodiment, each exhaust gas passage 56 is positioned adjacent a face portion 52.

Each exhaust gas passage 56 is at least partially defined by one or more sidewalls 58. Also, each exhaust gas passage 56 includes an opening 60 which receives the spent or unused gaseous precursor materials and/or inert gases. In certain embodiments, the opening 60 is of a length which is substantially equal to the length L of the coating apparatus 10. When the coating apparatus 10 is positioned within the deposition chamber 18 and above the glass substrate 12, the outlet 54 and exhaust gas opening 60 are provided near the deposition surface 14 of the glass substrate 12.

At least one baffle 62 may be provided within each exhaust gas passage 56. The at least one baffle 62 helps to ensure that the spent or unused precursor materials and/or inert gases are uniformly removed from the deposition chamber 18. The at least one baffle 62 may be configured as an elongated sheet and be formed of corrosion resistant metal. The at least one baffle 62 is preferably attached to a sidewall 58 and positioned in a substantially parallel relationship with the long axis 48 of the coating apparatus 10.

Preferably, the coating apparatus 10 is provided in the deposition chamber 18 at a predetermined distance above the glass substrate 12. As shown in FIG. 1, when the method is practiced in conjunction with the float glass manufacturing process, the coating apparatus 10 may be provided in the float bath chamber. However, it should be appreciated that the coating apparatus 10 may be provided in another portion of the float bath section 25, the annealing lehr 26, and/or in the gap 42 between the float bath section 25 and the annealing lehr 26.

The fluorine-containing compound may at some point be a liquid or a solid but is volatile such that it can be vaporized into a gaseous state prior to flowing into the coating apparatus 10. Preferably, the fluorine-containing compound is hydrogen fluoride (HF). More preferably, the fluorine-containing compound is anhydrous HF. However, it should be appreciated that alternative fluorine-containing compounds may be utilized in practicing the method.

The method may comprise providing a source 80 of the fluorine-containing compound. The fluorine-containing compound flows from its source 80 into the coating apparatus 10. In an embodiment, the method comprises introducing the fluorine-containing compound at one or more locations within the coating apparatus 10. Preferably, in this embodiment, the fluorine-containing compound is introduced into an exhaust gas passage 56. More preferably, the fluorine-containing compound is introduced into separate exhaust gas passages 56. However, it should be appreciated that the fluorine-containing compound may be introduced into one or more alternative locations within the coating apparatus.

For any particular combination of precursor materials, the optimum flow rate of the fluorine-containing compound for inhibiting the formation of the coating and/or by-products on one or more portions of the coating apparatus 10 may vary. However, the flow rate of fluorine-containing compound needed to inhibit the formation of the coating and/or by-products on one or more portions of the coating apparatus 10 may depend on the amount of silicon-containing compound flowing into the coating apparatus 10. Thus, in certain embodiments, the method comprises flowing a selected ratio of fluorine-containing compound to silicon-containing compound into the coating apparatus 10. Preferably, the ratio of fluorine-containing compound to silicon-containing compound flowing into the coating apparatus 10 is selected to be equal to about or greater than 2:1. More preferably, the ratio of fluorine-containing compound to silicon-containing compound flowing into the coating apparatus 10 is selected to be equal to about or greater than 4:1. Further, the ratio of fluorine-containing compound to silicon-containing compound flowing into the coating apparatus 10 may be selected to be equal to about or greater than 5:1.

In certain embodiments, it may be desirable to flow the fluorine-containing compound into the coating apparatus 10 in a uniform manner. In these embodiments and as illustrated in FIG. 3, a gas distribution tube 64 is positioned within the coating apparatus 10. Preferably, the fluorine-containing compound is directed through the gas distribution tube 64 before flowing into the coating apparatus 10. As the fluorine-containing compound can be introduced into the coating apparatus 10 at one or more locations, a plurality of gas distribution tubes 64 may be provided within the coating apparatus 10. For example, as shown in FIG. 3, a gas distribution tube 64 may be provided in each exhaust gas passage 56.

Each gas distribution tube 64 is preferably positioned adjacent the at least one baffle 62. The gas distribution tube 64 may be positioned above the at least one baffle 62 or, as shown in FIG. 3, below the at least one baffle 62. Preferably, each gas distribution tube 64 is positioned in a parallel relationship with the long axis 48 of the coating apparatus 10. Each gas distribution tube 64 may be secured to a sidewall 58 of the exhaust gas passage 56. As shown in FIG. 4, a plurality of supports 66 are provided to secure the gas distribution tube 64 to the sidewall 58 of the exhaust gas passage 56. The supports 66 may be equally spaced apart along the gas distribution tube 64.

An embodiment of the gas distribution tube 64 suitable for use in practicing the method is shown best in FIGS. 4 and 5. The gas distribution tube 64 is preferably metallic. Also, as the fluorine-containing compound and the environment within and adjacent the coating apparatus 10 may be corrosive, it is preferred that the gas distribution tube 64 is formed from a corrosion resistant metal or metal alloy. In an embodiment, the gas distribution tube 64 comprises nickel.

The gas distribution tube 64 comprises a cylindrical portion 68 which is hollow and has a plurality of equally spaced holes 70 formed therein. Preferably, the cylindrical portion 68 has a closed-end 72 and an oppositely positioned open-end 74. The gas distribution tube 64 may have a long axis 76 which is substantially equal in length $L_t$ to the length L of the coating apparatus 10. In an embodiment, the fluorine-containing compound flows into the open end 74 of the gas distribution tube 64 and is introduced into the coating apparatus 10 through the plurality of holes 70 formed in the cylindrical portion 68.

Preferably, the fluorine-containing compound flows into the coating apparatus 10 prior to forming the silica coating, i.e. before the precursor materials flow into the coating apparatus 10, and is of a flow rate which is substantially maintained during the formation of the silica coating. However, the fluorine-containing compound may initially flow into the coating apparatus 10 during the formation of the silica coating, i.e. while the precursor materials are flowing into the coating apparatus 10, and be of a flow rate which is substantially maintained during the continued formation of the silica coating. Further, the fluorine-containing compound may flow into the coating apparatus 10 after formation of the silica coating, i.e. after the silica precursor materials are no longer flowing into the coating apparatus 10, and be of a flow rate which removes the coating and/or by-products resulting from the deposition of the coating on one or more portions of the coating apparatus.

As above-noted, the fluorine-containing compound may flow into the coating apparatus 10 prior to forming the silica coating. In this embodiment, the fluorine-containing compound prevents formation of the coating and/or by-products resulting from the deposition of the coating on one or more portions of the coating apparatus 10. In other embodiments where the fluorine-containing compound flows into the coating apparatus 10 during or after formation of the silica coating, the fluorine-containing compound removes and/or prevents further formation of the coating and/or by-products on one or more portions of the coating apparatus 10.

Flowing the fluorine-containing compound into the coating apparatus 10 inhibits the formation of the coating and/or by-products resulting from the deposition of the coating on one or more portions of the coating apparatus 10 such as, for example, one or more surfaces of the coating apparatus 10. In an embodiment, the coating and/or by-products are inhibited on a surface which at least partially define the exhaust gas passage 56 such as, for example, the one or more sidewalls 58. In another embodiment, coating and/or by-product formation is inhibited on a surface within the exhaust gas passage 56 such as, for example, a surface of the at least one baffle 62. However, the method is not limited to inhibiting coating and/or by-product formation on surfaces which define or are within the exhaust gas passages 56. Thus, in certain embodiments, coating and/or by-product formation is inhibited on at least one face surface 53 of the coating apparatus 10.

EXAMPLES

A coating apparatus having a long axis was positioned transversely over a glass ribbon within a float bath chamber and utilized to form a silica coating thereon. A non-oxidizing atmosphere of a mixture of nitrogen and hydrogen was maintained in the float bath chamber. The pressure in the float batch chamber was maintained at essential atmospheric pressure. The approximate glass ribbon temperature and internal temperature of the coating apparatus for Examples 1-5 are provided in Table 1, below.

To form the silica coating, gaseous precursor materials were mixed and flowed into the coating apparatus. The gaseous mixture of precursor materials comprised $SiH_4$, $O_2$, $O_2H_4$. The gaseous mixture also comprised $N_2$ as a diluent. The flow rate of $SiH_4$ into the coating apparatus for Examples 1-5 is provided, below.

The coating apparatus had two exhaust gas passages and substantially all of the spent/unused precursor materials were exhausted from the float bath chamber through the exhaust gas passages. A gas distribution tube was positioned within each exhaust gas passage and provided to extend parallel to the long axis of the coating apparatus. Each gas distribution tube included a hollow cylindrical portion and had a plurality of equally spaced holes formed therein.

Prior to forming the silica coating, a gaseous mixture of anhydrous HF and $N_2$ flowed into the coating apparatus and was introduced into each exhaust gas passage via the gas distribution tubes. The flow of the HF and $N_2$ mixture was split between and directed into the gas distribution tubes before the gaseous mixture of $HF/N_2$ was introduced into the exhaust gas passages. The total flow rates of HF and $N_2$ for Examples 1-5 are provided, below. The flow of the $HF/N_2$ mixture was maintained while the silica coating was formed.

TABLE 1

EXPERIMENTAL CONDITIONS FOR EXAMPLES 1-5

| Example | $SiH_4$ flow rate (slm) | HF flow rate (slm) | $N_2$ flow rate (slm) | Pressure (atmospheres) | Coating Apparatus Temp. (° F.) | Glass Ribbon Temp. (° F.) |
|---|---|---|---|---|---|---|
| 1 | 1.6 | 20 | 10 | 1 | 350 | ~1200-1250 |
| 2 | 1.6 | 10 | 10 | 1 | 350 | ~1200-1250 |
| 3 | 1.6 | 8 | 10 | 1 | 350 | ~1200-1250 |
| 4 | 1.6 | 6 | 10 | 1 | 350 | ~1200-1250 |
| 5 | 1.6 | 4 | 10 | 1 | 350 | ~1200-1250 |

As was observed under the conditions reported for Examples 1-5 and will be described below, flowing a fluorine-containing compound such as HF into the coating apparatus while depositing the silica coating on the glass substrate inhibits the formation of the coating and/or byproducts on one or more portions of the coating apparatus. Additionally, the silica coating formed on the glass substrate comprises no fluorine or only trace amounts thereof.

Under the conditions of Examples 1-3, inhibition of the formation of the coating and/or byproducts on surfaces defining the exhaust passages was excellent. Under the conditions of Example 4, inhibition of the formation of the coating and/or byproducts on the aforementioned surfaces was sufficient but not as good as observed under the conditions reported for Examples 1-3. Under the conditions of Example 5, inhibition of the formation of the coating and/or byproducts on the surfaces defining the exhaust gas passages was not as good as observed under the conditions reported for Example 4.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims which follow.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method of depositing a coating utilizing a coating apparatus, comprising:
   providing a coating apparatus in a float bath section of a float glass manufacturing process and above a glass substrate, the coating apparatus comprising one or more exhaust gas passages and one or more face surfaces, the one or more face surfaces defining a space between the coating apparatus and a surface of the glass substrate; and
   forming the coating on the surface of the glass substrate while introducing a fluorine-containing compound into the one or more exhaust gas passages of the coating apparatus so that the coating contains no fluorine or only trace amounts thereof, and wherein the fluorine-containing compound inhibits the formation of the coating on one or more portions of the one or more exhaust gas passages of the coating apparatus.

2. The method as claimed in claim 1, wherein the coating comprises an oxide of silicon.

3. The method as claimed in claim 1, wherein the glass substrate is moving.

4. The method as claimed in claim 1, wherein the coating is formed on the surface of the glass substrate by chemical vapor deposition.

5. The method as claimed in claim 1, wherein the glass substrate is at a temperature of between about 1050° F. and 1400° F.

6. The method as claimed in claim 1, wherein the fluorine-containing compound is introduced into each exhaust gas passage via separate gas distribution tubes.

7. The method as claimed in claim 1, wherein the fluorine-containing compound is anhydrous HF.

8. The method as claimed in claim 1, wherein the one or more portions of the coating apparatus includes one or more surfaces and the fluorine-containing compound inhibits the formation of the coating on at least one of the one or more surfaces.

9. The method as claimed in claim 1, further comprising forming a gaseous mixture comprising a silicon-containing compound, an oxygen-containing compound and a radical scavenger, flowing the gaseous mixture into the coating apparatus and directing the gaseous mixture through the coating apparatus to the surface of the glass substrate.

10. The method as claimed in claim 1, wherein the coating is a silica coating.

11. The method as claimed in claim 1, wherein a ratio of the fluorine-containing compound to a silicon-containing compound flowing into the coating apparatus is equal to or greater than 2:1.

12. The method as claimed in claim 11, wherein the ratio of the fluorine-containing compound to the silicon-containing compound flowing into the coating apparatus is equal to or greater than 4:1.

13. The method as claimed in claim 1, wherein the coating contains no fluorine.

14. A method of depositing a coating utilizing a coating apparatus, comprising:
   providing a coating apparatus in a float bath section of a float glass manufacturing process and above a moving glass substrate, the coating apparatus comprising one or more exhaust gas passages;
   forming a gaseous mixture comprising a silicon-containing compound, an oxygen-containing compound and a radical scavenger, flowing the gaseous mixture into the coating apparatus and directing the gaseous mixture through the coating apparatus to the surface of the glass substrate;
   introducing a fluorine-containing compound into the one or more exhaust gas passages of the coating apparatus, wherein a ratio of the fluorine-containing compound to the silicon-containing compound flowing into the coating apparatus is equal to or greater than 2:1; and
   forming a silica coating on the surface of the moving glass substrate which contains no fluorine or only trace amounts thereof while introducing the fluorine-containing compound into the at least one of the one or more exhaust gas passages, wherein the fluorine-containing compound inhibits the formation of a silica coating in the one or more exhaust gas passages.

15. The method as claimed in claim 14, wherein the coating contains no fluorine.

* * * * *